United States Patent
Lee et al.

(10) Patent No.: US 8,633,109 B2
(45) Date of Patent: Jan. 21, 2014

(54) SOFT ERROR RATE (SER) REDUCTION IN ADVANCED SILICON PROCESSES

(75) Inventors: Yung-Huei Lee, Danshui (TW); Chou-Jie Tsai, Tainan (TW); Chia-Fang Wu, Tainan (TW); Jang Jung Lee, Hsinchu (TW); Wei-Cheng Chu, Tainan (TW); Dong Gui, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 95 days.

(21) Appl. No.: 13/031,897

(22) Filed: Feb. 22, 2011

(65) Prior Publication Data
US 2012/0032334 A1 Feb. 9, 2012

Related U.S. Application Data

(60) Provisional application No. 61/370,671, filed on Aug. 4, 2010.

(51) Int. Cl.
*H01L 21/44* (2006.01)

(52) U.S. Cl.
USPC .................... 438/675; 438/597; 438/685

(58) Field of Classification Search
USPC ............ 257/770; 430/315; 438/675, 685, 597
See application file for complete search history.

(56) References Cited

U.S. PATENT DOCUMENTS

| | | | | |
|---|---|---|---|---|
| 4,920,065 A | * | 4/1990 | Chin et al. | 438/243 |
| 5,136,355 A | * | 8/1992 | Kerr et al. | 257/382 |
| 5,395,783 A | * | 3/1995 | Baumann et al. | 438/239 |
| 5,973,372 A | * | 10/1999 | Omid-Zohoor et al. | 257/383 |
| 6,204,160 B1 | * | 3/2001 | Russell et al. | 438/602 |
| 2001/0054769 A1 | * | 12/2001 | Raaijmakers et al. | 257/758 |
| 2004/0247788 A1 | * | 12/2004 | Fang et al. | 427/250 |
| 2007/0066060 A1 | * | 3/2007 | Wang | 438/685 |
| 2007/0184572 A1 | * | 8/2007 | Kohli et al. | 438/97 |

FOREIGN PATENT DOCUMENTS

JP 2011-014667 * 1/2011

OTHER PUBLICATIONS

Shijie Wen et al., "Thermal Neutron Soft Error Rate for SRAMs in the 90nm-45nm Technology Range", 978-1-4244-5431-0, 2010 IEEE, pp. SE.5.1-SE.5.4.
Shi-Jie Wen et al., "B10 Finding and Correlation to Thermal Neutron Soft Error Rate Sensitivity for SRAMs in the Sub-Micron Technology", 2 pages, Publication date Jan. 20, 2011.

* cited by examiner

*Primary Examiner* — Walter H Swanson
*Assistant Examiner* — Wilner Jean Baptiste
(74) *Attorney, Agent, or Firm* — Haynes and Boone, LLP

(57) ABSTRACT

Provided is a method of fabricating a semiconductor device. The method includes providing a substrate. The method includes forming a portion of an interconnect structure over the substrate. The portion of the interconnect structure has an opening. The method includes obtaining a boron-containing gas that is free of a boron-10 isotope. The method includes filling the opening with a conductive material to form a contact. The filling of the opening is carried out using the boron-containing gas. Also provided is a semiconductor device. The semiconductor device includes a substrate. The semiconductor device includes an interconnect structure formed over the substrate. The semiconductor device includes a conductive contact formed in the interconnect structure. The conductive contact has a material composition that includes Tungsten and Boron, wherein the Boron is a $^{11}$B-enriched Boron.

20 Claims, 6 Drawing Sheets

SOFT ERROR RATE (SER) REDUCTION IN ADVANCED SILICON PROCESSES

PRIORITY DATA

This application claims priority to Provisional Application Ser. No. 61/370,671, filed on Aug. 4, 2010, entitled "SOFT ERROR RATE (SER) REDUCTION IN ADVANCED SILICON PROCESSES," the entire disclosure of which is incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs. In the course of integrated circuit evolution, functional density (i.e., the number of interconnected devices per chip area) has generally increased while geometry size (i.e., the smallest component that can be created using a fabrication process) has decreased. This scaling down process generally provides benefits by increasing production efficiency and lowering associated costs.

As semiconductor device sizes continue to shrink, soft error rate (SER) may become a problem. A soft error is an error caused by a wrong or incorrect signal (for example by noise) within a device, which leads to an incorrect operation of the device, while the device itself may not be defective. A soft error rate is the rate at which the device encounters soft errors. As semiconductor technology nodes progress to newer generations, particularly for devices fabricated under the 65 nanometer (nm) node and beyond, the soft error rate for these devices becomes more pronounced. Current semiconductor fabrication techniques have not proposed an effective method of reducing the soft error rate with respect to the newer technology nodes.

Therefore, while existing methods of soft error rate reduction for semiconductor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
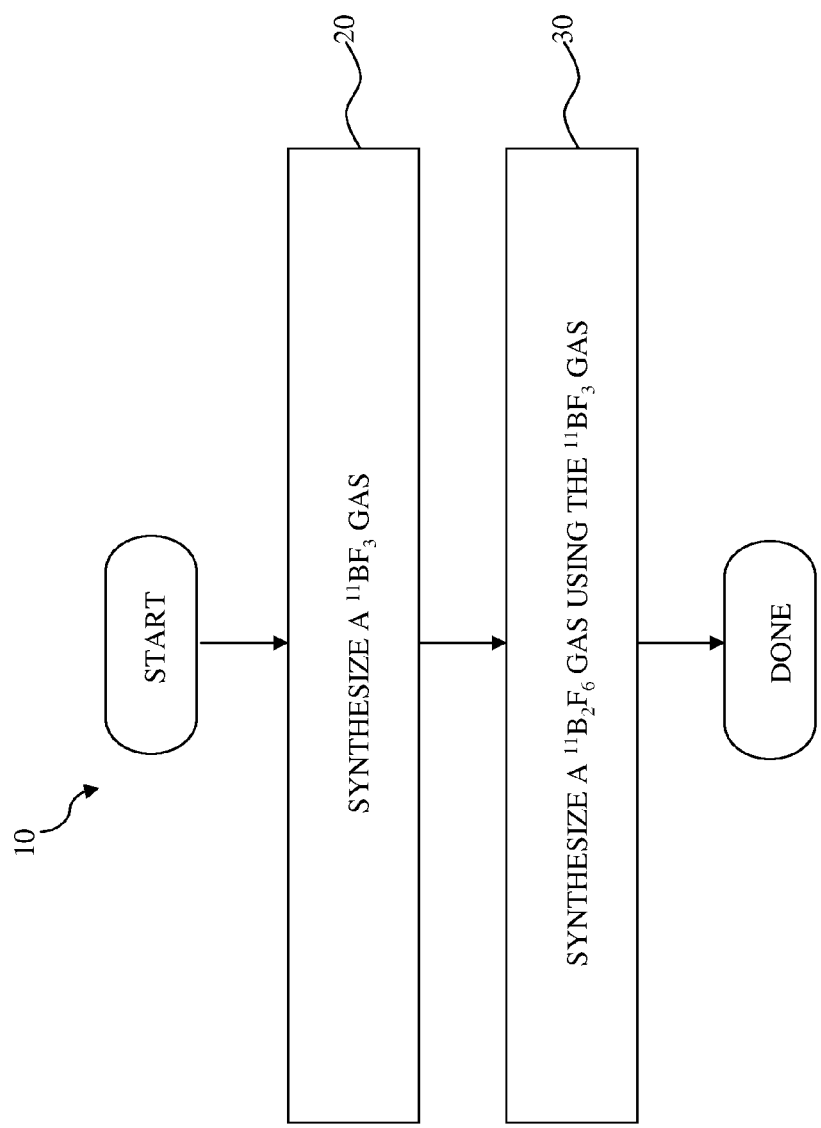
FIG. 1 is a flowchart illustrating a method for synthesizing a purified Boron gas according to various aspects of the present disclosure.

FIG. 1 is a flowchart illustrating a method 10 for synthesizing a purified B-11 isotope gas according to various aspects of the present disclosure. In the ensuing discussions, B-11 and $^{11}B$ may be used interchangeably to designate the Boron-11 isotope. Similarly, B-10 and $^{10}B$ may be used interchangeably to designate a Boron-10 isotope. B-10 and B-11 are different isotopes of Boron and each has five protons. However, the isotope B-10 has five neutrons, but the isotope B-11 has six neutrons. In nature, B-10 and B-11 exist in an approximately 20%/80% split (about 20% B-10 and about 80% B-11).

Referring to FIG. 1, the method 10 involves a multi-stage exchange-distillation process. The method 10 includes a block 20 that synthesizes a $^{11}BF_3$ gas. In an embodiment, the following chemical process is used to generate the $^{11}BF_3$ gas:

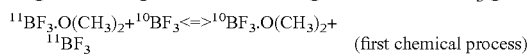
(first chemical process)

wherein $^{11}BF_3 \cdot O(CH_3)_2$ and $^{10}BF_3 \cdot O(CH_3)_2$ are in liquid form, and $^{10}BF_3$ and $^{11}BF_3$ are in gas form.

The first chemical process listed above is a two-way chemical reaction. The direction of the reaction may be controlled by adjusting a pressure of the chemical process. For example, a low pressure may cause the direction of the first chemical process to go from "left" to "right", and thus produce the $^{10}BF_3 \cdot O(CH_3)_2$ liquid and the $^{11}BF_3$ gas. Since the $^{11}BF_3$ component is in gas form, it can be separated from the $^{10}BF_3 \cdot O(CH_3)_2$ liquid and be collected for subsequent use.

The method 10 continues with block 30 in which the $^{11}BF_3$ gas is used to synthesize a $^{11}B_2F_6$ gas. In an embodiment, the following chemical process is used to generate the $^{11}B_2H_6$ gas:

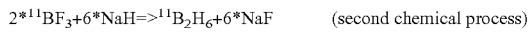
(second chemical process)

$^{11}B_2H_6$ can be separately collected from the NaF. $^{11}B_2H_6$ is considered a purified B-11 isotope-containing gas (or a $^{11}B$-enriched gas) that is substantially free of the B-10 isotope. The B-11 content of the Boron material in the purified $^{11}B_2H_6$ gas is substantially greater than about 80%, for example, about 95%. In an embodiment, the B-11 content of the Boron material in the purified Boron gas is about 99.7%, meaning that the B-10 isotope of the purified Boron gas is less than about 0.3%. Additional purification processes may be performed to further enrich the B-11 content for the gas if a higher concentration of the B-11 isotope is desired. The B-11 isotope of the $^{11}B_2H_6$ gas is also very stable. Due to these properties, the $^{11}B_2H_6$ gas will be used in semiconductor fabrication processes discussed below.

Figure 2:
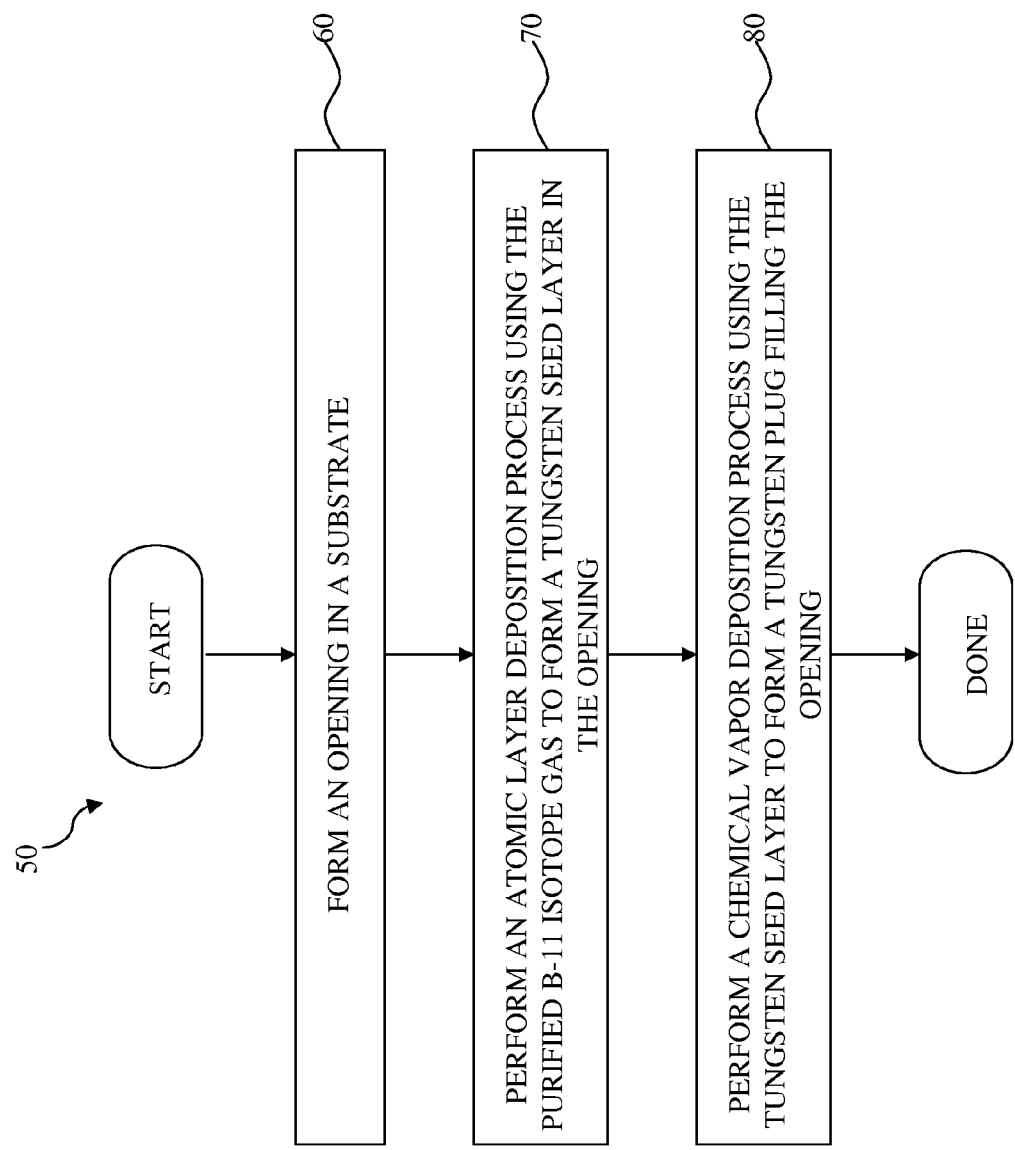
FIG. 2 is a flowchart illustrating a method of utilizing the purified Boron gas in a semiconductor fabrication process according to various aspects of the present disclosure.

FIG. 2 is a flowchart illustrating a method 50 of using the purified $^{11}B_2H_6$ gas in a semiconductor fabrication process according to various aspects of the present disclosure. Referring to FIG. 2, the method 50 includes a block 60 in which an opening is formed in a substrate (also referred to as a wafer). In an embodiment, the substrate is a semiconductor substrate, for example a silicon substrate that is doped with either a P-type or an N-type dopant. Various types of semiconductor devices may be formed within the substrate. These semiconductor devices may include Field-Effect-Transistor (FET) devices, or bipolar transistor devices. The substrate may also include an interconnect structure that includes multiple interconnect layers (metal layers) containing metal lines for interconnecting the various semiconductor devices of the substrate. Electrical connections between the different interconnect layers may be established through contacts/vias.

In block 60, the opening may be formed in the interconnect structure so that the opening may be filled with a conductive material (such as Tungsten) to form one of the contacts later. Thus, the opening may also be referred to as a contact hole.

The method 50 continues to block 70 in which an atomic layer deposition (ALD) process is performed to partially fill the contact hole using the purified B-11 isotope gas. The ALD process may take place in an ALD chamber. In an embodiment, the ALD process uses the $^{11}B_2H_6$ gas collected by the method 10 of FIG. 1 as a precursor. In such embodiment, the ALD process has a plurality of cycles. Each cycle includes a soaking process and a nucleation process. The soaking process is performed at a process temperature of above 250 degrees Celsius. During the soaking process, the following chemical process occurs:

$^{11}B_2H_6 => 2*^{11}B+3*H_2$     (third chemical process)

In other words, the purified $^{11}B_2H_6$ gas is used to deposit a thin layer (in an atomic scale) of B-11 in the contact hole. The other product of the chemical process $3*H_2$ is a gas and will escape, or otherwise not get collected.

Each cycle of the ALD process also includes a nucleation process. The nucleation process is performed at a process pressure from about 2 Tons to about 15 Torrs. During the nucleation process, the following chemical process occurs:

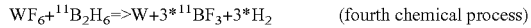
$WF_6+^{11}B_2H_6 => W+3*^{11}BF_3+3*H_2$     (fourth chemical process)

$WF_6$ is used as another precursor. Therefore, the purified $^{11}B_2H_6$ gas is used to deposit a thin layer (in an atomic scale) of Tungsten (W) in the contact hole. Since the soaking process precedes the nucleation process, the thin layer of Tungsten formed in the contact hole may contain the B-11 isotope. The other products of the chemical process $^{11}BF_3$ and $3*H_2$ are gases and will escape, or otherwise not get collected.

After a number of the above cycles (each cycle including the soaking process followed by the nucleation process) are performed, a Tungsten layer is formed to partially fill the contact hole. This Tungsten layer contains B-11, which is stable.

The method 50 continues with block 80 in which a chemical vapor deposition (CVD) process is performed to form a Tungsten plug filling the contact hole. The CVD process uses the Tungsten layer formed by the ALD process of block 70 discussed above as a seed layer to deposit more Tungsten material in the contact hole. The CVD process may be performed at a process temperature from about 350 degrees Celsius to about 500 degrees Celsius and a process pressure from about 200 Torrs to about 400 Torrs. The CVD process may take place in a CVD chamber. During the CVD process, the following chemical process occurs:

$WF_6+3*H_2 => W+6*HF$     (fifth chemical process)

The 6*HF product of the chemical process is a gas and may escape or otherwise not get collected. The W product of the chemical process is a Tungsten bulk that fills the contact hole, and may also be referred to as a Tungsten plug. Thus, throughout the entire fabrication process of forming the Tungsten plug, the B-10 isotope is not used. Instead, a stable B-11 isotope is used to help form the Tungsten plug and may be present in the finally-formed Tungsten plug.

Also, one of the reasons why a two staged process (multi-cycle ALD process followed by the CVD process) is used to form the Tungsten plug is that the ALD process is used to improve gap filling performance. As technology nodes become smaller, device sizes decrease, and the contact holes become smaller as well. Using traditional deposition processes, it is difficult to fill such small contact holes without leaving gaps therein. These gaps may degrade device performance or result in device defects. Here, the ALD process is utilized to fill a bottom portion of the contact holes without gaps, since the ALD process is capable of forming small features in a very precise fashion. Thereafter, the CVD process that forms the bulk of the Tungsten plug may be able to fill the rest of the contact hole without leaving gaps either.

Figure 3:
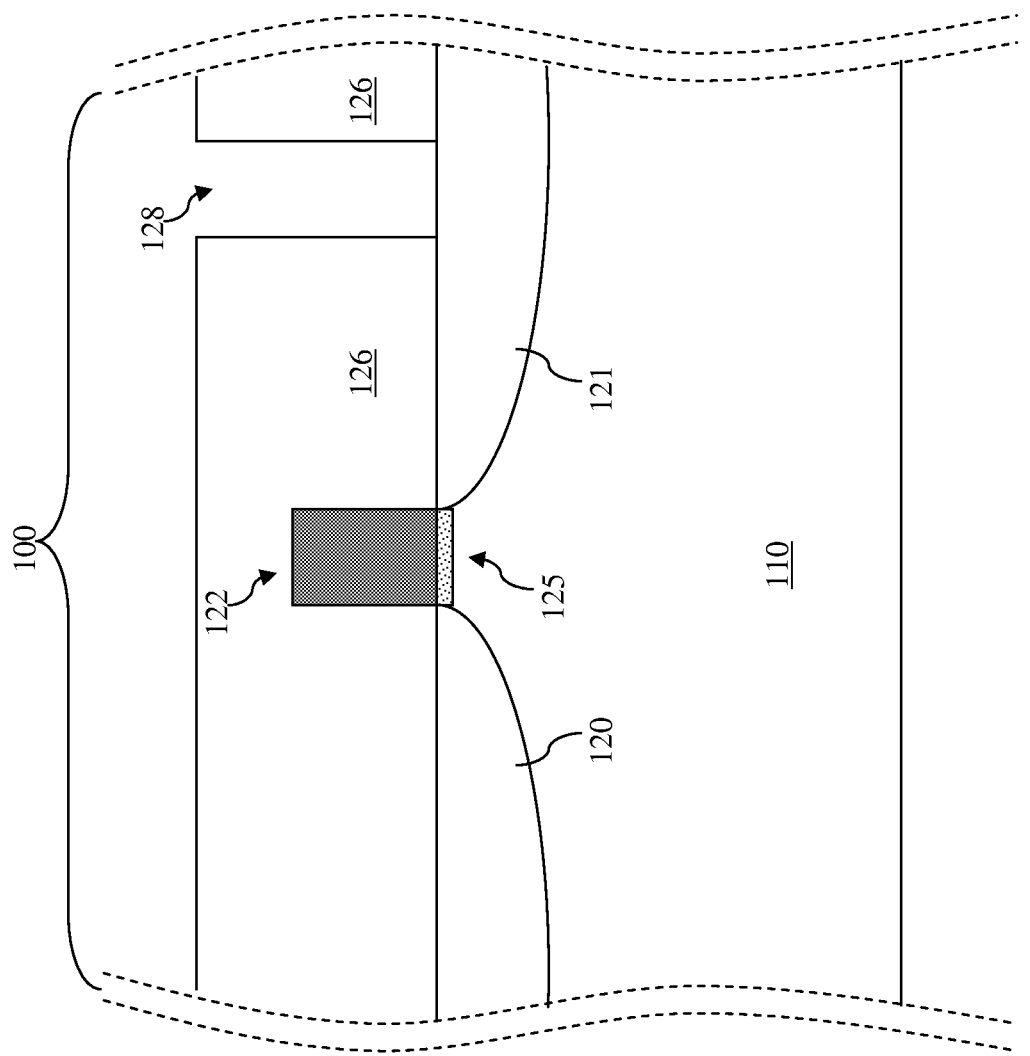
FIG. 3-4 are diagrammatic fragmentary cross-sectional side views of a semiconductor device at a stage of fabrication in accordance with the methods illustrated in FIGS. 1 and 2.
Figure 4:
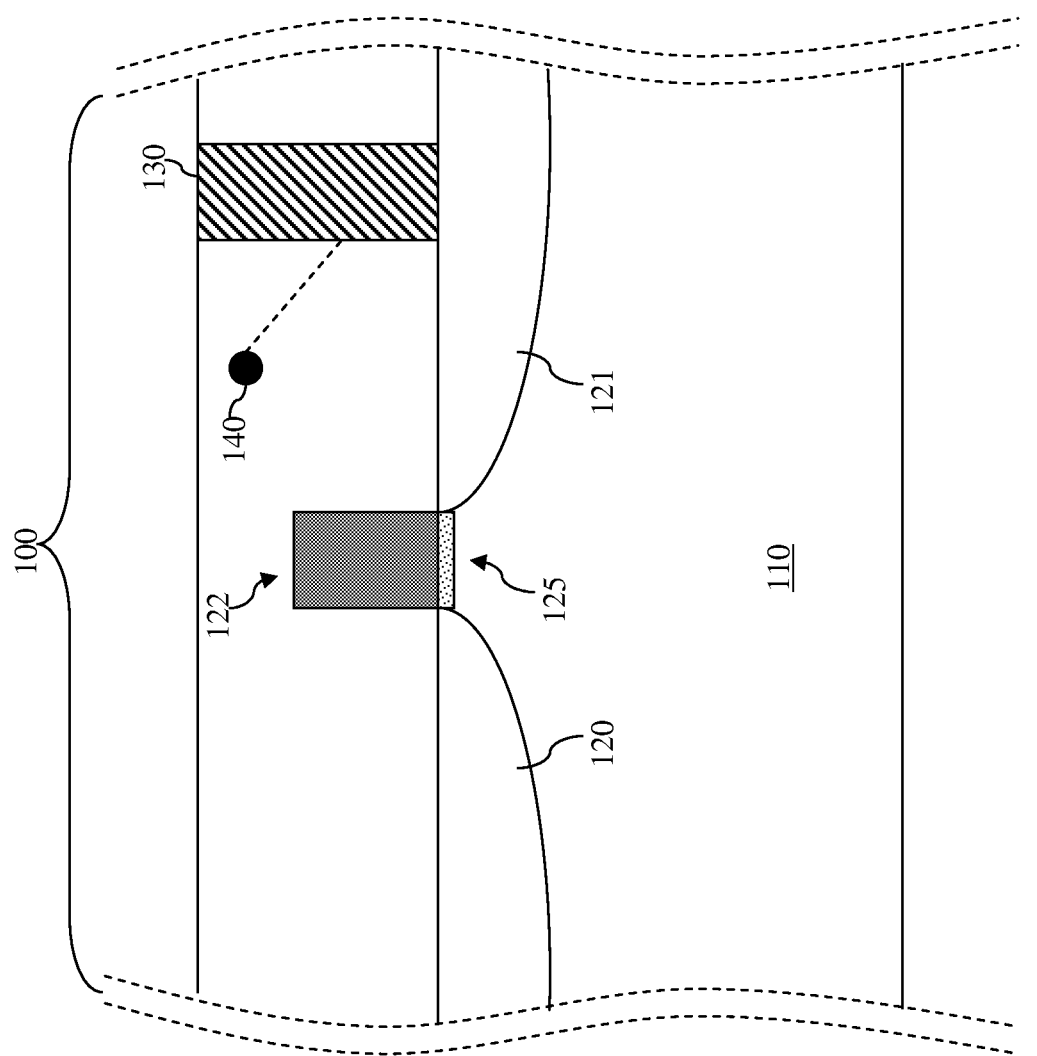
Figure 5:
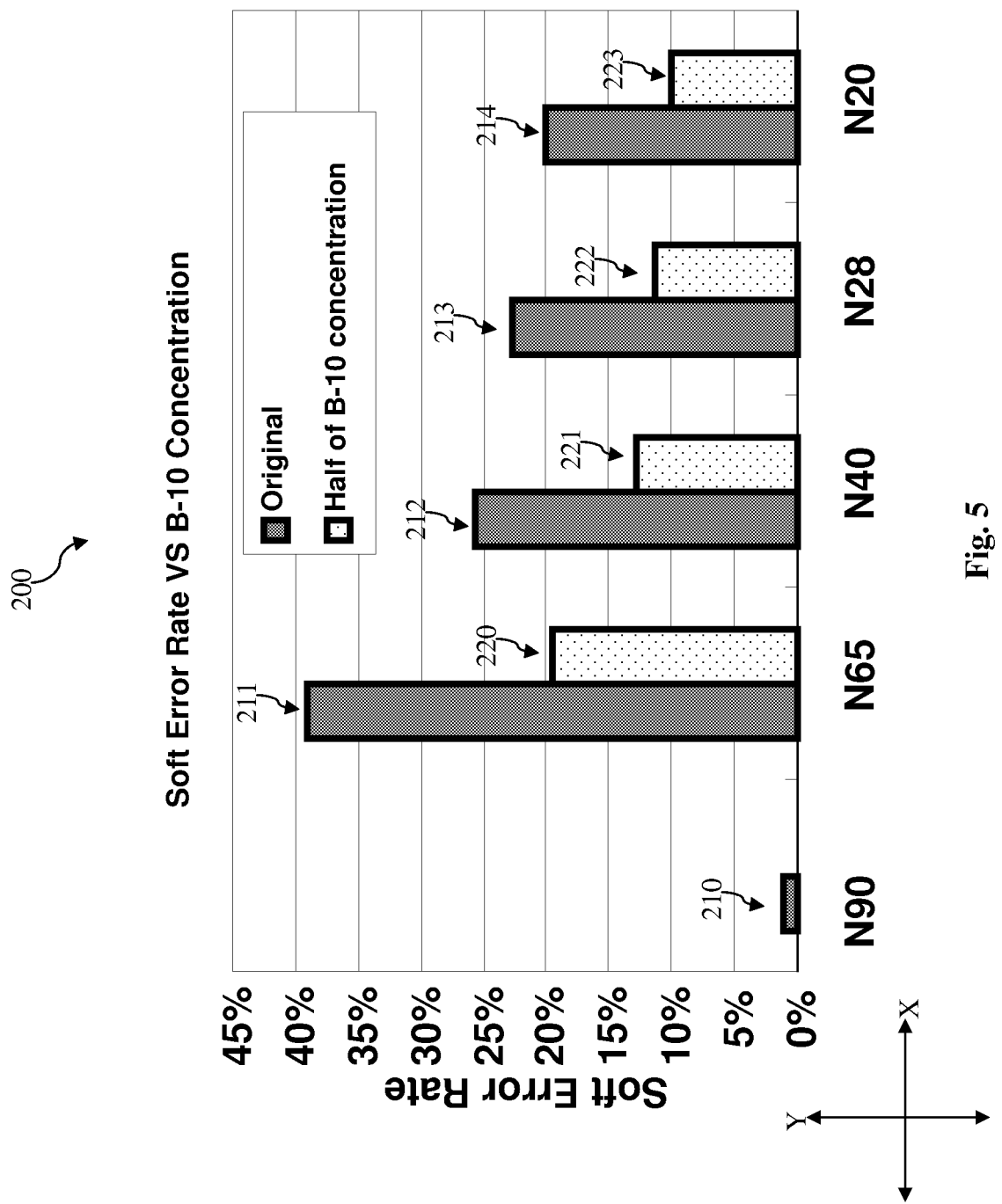
FIG. 5 is a chart illustrating simulation results that demonstrate correlation between soft error rate and concentration of B-10 in a Tungsten plug.

FIGS. 3-4 are diagrammatic fragmentary cross-sectional side views of a semiconductor device 100 that help illustrate advantages of the embodiments disclosed herein. Referring to FIG. 3, the semiconductor device 100 has a doped silicon substrate 110. The semiconductor device 100 includes a FET transistor device having source/drain regions 120 and 121, and a gate structure 122. The source/drain regions are each doped by a P-type dopant such as Boron, or an N-type dopant such as Arsenic or Phosphorous. Although not illustrated, each of the source/drain regions 120 and 121 may further include a lightly-doped source/drain region and a heavily doped source/drain region. In an embodiment, the semiconductor device 100 is a semiconductor device belonging to a technology node or technology generation of less than 90 nanometer (nm). For example, the semiconductor device 100 may be a 65 nm technology node transistor, a 40 nm technology node transistor, a 28 nm technology node transistor, or a 20 nm technology node transistor. In some embodiments, the semiconductor device 100 may include FINFET transistors or vertical transistors.

The gate structure 122 is disposed over the substrate 110 and in between the source/drain regions 120 and 121. The gate structure 122 includes a gate dielectric layer and a gate electrode layer formed over the gate dielectric layer. In one embodiment, the gate dielectric layer includes an oxide material and the gate electrode layer includes a polysilicon material. In another embodiment, the gate dielectric layer includes a high-k dielectric material and the gate electrode layer includes a metal material. When suitable voltages are applied to the source/drain regions 120 and 121 and the gate structure 122, a conductive channel region 125 may be formed in a portion of the substrate 110 underneath the gate structure 122.

Next, an interlayer dielectric 126 is formed over the substrate 110 and over the gate 122. The interlayer dielectric 126 is a part of an interconnect structure (not illustrated) that will be formed later. The interconnect structure will have a plurality of interconnected metal layers and will provide electrical connections between the semiconductor device 100 and external devices. The interlayer dielectric 126 may contain a low-k material. An opening 128 is formed in the interlayer dielectric 126. In an embodiment, the opening 128 is formed over one of the source/drain regions 120 and 121. In other embodiments, the opening 128 may be formed over the gate structure 122.

Referring to FIG. 4, a Tungsten plug 130 is formed in the opening 128. As discussed above, the interconnect structure may have a plurality of interconnect layers. Here, the Tungsten plug 130 may be used to establish electrical connections to the source/drain region 121. Similarly, other Tungsten plugs that are similar to the Tungsten plug 130 may be formed over the gate structure 122 or the other source/drain region 120. For reasons of simplicity, these other Tungsten plugs are not illustrated herein.

The Tungsten plug 130 is formed in accordance with the methods 10 and 50 discussed above in FIGS. 1 and 2. Stated differently, the Tungsten plug 130 is formed without using the B-10 isotope but rather with a stable B-11 isotope. In an embodiment, a $^{11}BF_3$ gas is first generated using the first chemical process discussed above with reference to the block 20 of FIG. 1. Next, the $^{11}BF_3$ gas is used to generate the $^{11}B_2H_6$ gas by performing the second chemical process discussed above with reference to the block 30 of FIG. 1. The B-11 content of the $^{11}B_2H_6$ gas is B-11 enriched, and thus is substantially free of B-10. In an embodiment, the B-11 content of the boron in the $^{11}B_2H_6$ gas is greater than about 95%, for example greater or equal to about 99.7%. In other words, the B-10 content of the boron in the $^{11}B_2H_6$ gas is less than about 5%, for example less or equal about 0.3%. Thereafter, the B-11 enriched $^{11}B_2H_6$ gas is used as a precursor in an ALD process to form a Tungsten seed layer in a contact hole. The ALD process includes a plurality of soaking and nucleation processes. The Tungsten seed layer includes Boron, which in this case is the B-11 enriched Boron. The Tungsten seed layer is substantially free of B-10. A CVD process is then performed to substantially fill the contact hole with Tungsten, thereby forming the Tungsten plug 130.

Thermal neutrons 140 may exist in the air around the Tungsten plug 130. The thermal neutrons 140 may move rapidly and may hit the Tungsten plug 130, for example the sidewalls of the Tungsten plug 130. Had the B-10 isotope been used to form a Tungsten plug, the Tungsten plug would contain the B-10 isotope material. In that case, the thermal neutrons 140 may be absorbed by the B-10 isotope in the Tungsten plug in an alpha fission process. The result is that an unstable B-11 isotope will be formed. The unstable B-11 isotope may be transformed into Lithium (Li) and alpha particles. If that Tungsten plug is located relatively close to a transistor device (for example less than about 0.5 um to the channel region 125), the alpha particles may cause disruption or electrical interference to the transistor device, which may manifest itself as degradation in soft error rate.

According to the embodiments disclosed herein, since the Tungsten plug 130 contains the stable B-11 isotope instead of the B-10 isotope, the thermal neutrons 140 may hit the Tungsten plug 130 without causing unstable B-11 isotope to be formed. As such, no alpha fission will occur, and no alpha particles will be formed. Consequently, the soft error rate is greatly improved by implementing the methods discussed above. This holds true even if the Tungsten plug 130 is located in close proximity (for example less than about 0.5 um to the channel region 125) to the channel region 125 or the source/drain regions 120-121.

In comparison, traditional methods of semiconductor fabrication for the 65-nm technology node and beyond have yet to recognize the problems associated with the combination of thermal neutrons 140 and the presence of B-10 in a Tungsten plug. For example, these traditional methods may fail to realize that using Boron merely as a precursor in the ALD process may introduce a non-negligible amount of B-10 material in the Tungsten plug. As another example, the traditional methods may also fail to recognize the impact caused by these non-negligible amounts of B-10 materials in terms of soft error rate. Furthermore, in older technology generations, since the geometry sizes were bigger, the Tungsten plugs formed may be located far enough from noise-sensitive semiconductor components. Besides, B-10 materials are not applied in the process. For these reasons discussed above, traditional methods have failed to take measures to prevent the use of B-10 gas in forming Tungsten plugs. Consequently, semiconductor devices fabricated with these traditional methods often suffer from unacceptably high soft error rate, particularly as technology generations become smaller and smaller (which leads to increasingly smaller geometry sizes).

In comparison, the present disclosure recognizes that merely using Boron as a precursor in the ALD process will leave a non-negligible amount of B-10 material in the Tungsten plug. The present disclosure also recognizes the harmful effects the B-10 material may cause for the ever-shrinking semiconductor devices. Thus, the present disclosure involves taking meticulous measures to purify the Boron gas to derive a B-11 enriched Boron gas that is substantially free of the B-10 isotope. In this manner, the Tungsten plug 130 can be formed to be substantially free of B-10, thereby significantly improving the soft error rate problem.

In addition, the method disclosed herein may be used in other fabrication processes. For example, a silicon germanium (SiGe) epitaxy process associated with 40-nm technology nodes and beyond may involve the use of Boron. The B-10 isotope concentration associated with the SiGe process is about two orders of magnitude lower than that of the Tungsten-plug though. As such, the soft error rate caused by the B-10 isotope in the SiGe epitaxy process is not as significant in comparison with the Tungsten-plug process. Nevertheless, if soft error rate needs to be improved, the B-11 isotope may be used for the SiGe epitaxy process instead of the B-10 isotope for reasons similar to those discussed above.

Although not illustrated, it is understood that additional processes may be performed to complete the fabrication of the semiconductor device 100. For example, the rest of the interconnect structure to which the Tungsten plug 130 belongs may be formed. The wafer containing the semiconductor device 100 may also undergo passivation, testing, wafer dicing/slicing, and packaging processes.

FIG. 4 is a chart 200 of simulation results that illustrate the correlation between soft error rate and concentration of B-10 in a Tungsten plug. The Y-axis of the chart 200 illustrates a simulated soft error rate in terms of percentage. The X-axis of the chart 200 illustrates technology nodes: N90 (90-nm node), N65 (65-nm node), N40 (40-nm node), N28 (28-nm node), and N20 (20-nm node). Bars 210-214 are illustrated for these technology nodes, respectively. The bars 210-214 represent simulated results of soft error rate associated with a predetermined B-10 isotope concentration in the Tungsten plug. Bars 220-223 are also illustrated for the N65, N40, N28, and N20 nodes, respectively. The bars 220-223 represent simulated results of soft error rate associated with half of the predetermined B-10 isotope concentration in the Tungsten plug.

As is shown in FIG. 4, for the N90 technology node, soft error rate caused by B-10 in the Tungsten plug is negligibly low, so that no further analysis of it is necessary. For the N65 technology node and beyond (smaller nodes), soft error rate caused by B-10 in the Tungsten plug may become too great to ignore. However, it can be seen that as the concentration of B-10 decreases, soft error rate drops correspondingly. The concentration of B-10 in a Tungsten plug and the soft error rate may have a 1:1 inverse correlation. In other words, the soft error rate may be directly and inversely proportional to the concentration of B-10 in the Tungsten plug. Hence, by getting rid of B-10 in the Tungsten plug, the present disclosure will significantly improve soft error rate.

Figure 6:
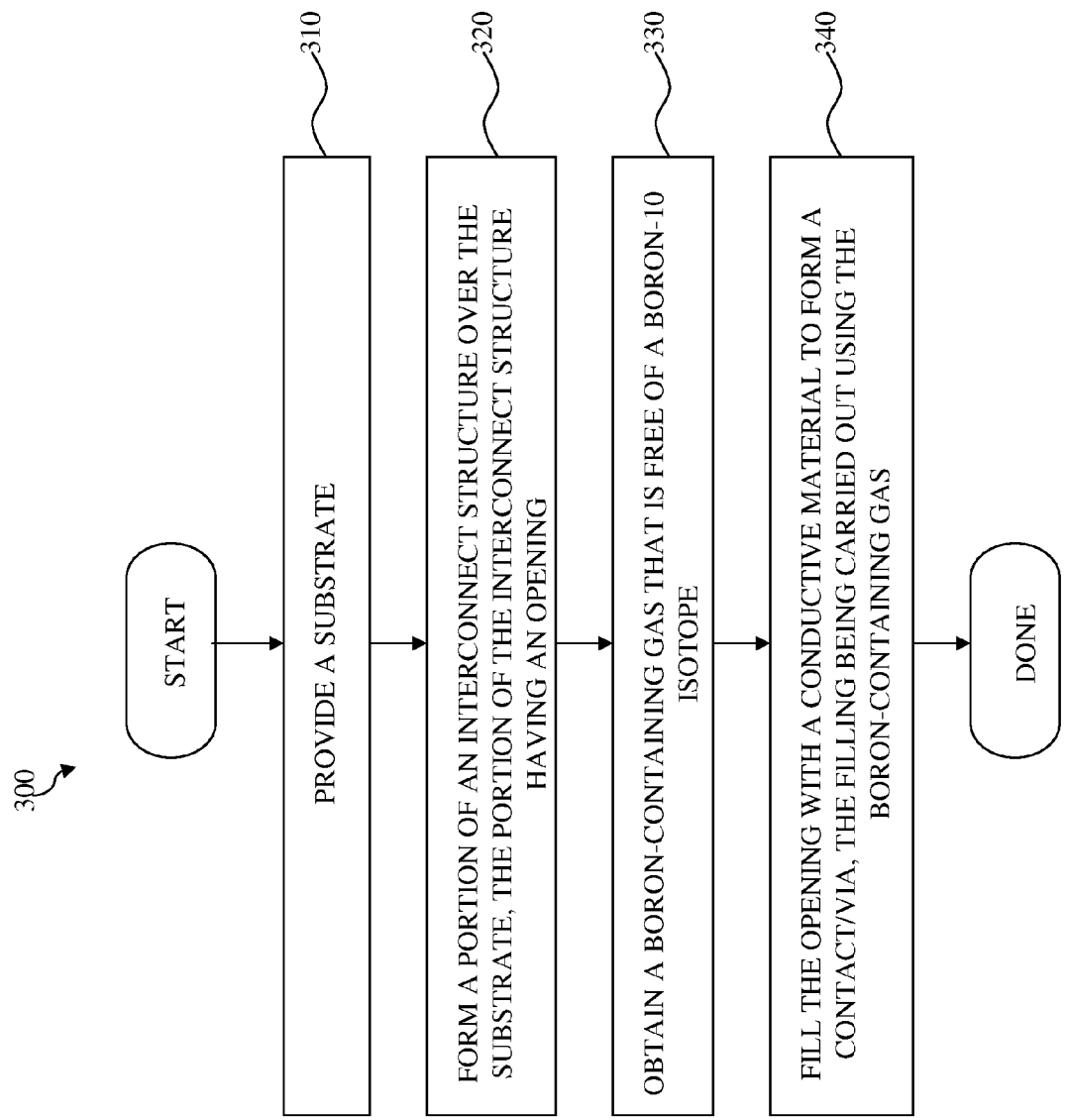
FIG. 6 is a flowchart illustrating a method of fabricating a semiconductor device in accordance with the methods disclosed in FIGS. 1 and 2.

FIG. 6 is a flowchart illustrating a method of fabricating a semiconductor device in accordance with various aspects of the methods disclosed in FIGS. 1 and 2. The method 300 begins with block 310 in which a substrate is provided. The method 300 continues with block 320 in which a portion of an interconnect structure is formed over the substrate. The portion of the interconnect structure has an opening. The method 300 continues with block 330 in which a boron-containing gas is obtained. The boron-containing gas is substantially free of a Boron-10 isotope. The method 300 continues with block 340 in which the opening is filled with a conductive material to form a contact. The filling is carried out using the Boron-containing gas.

The embodiments of the present disclosure offer advantages over existing methods. It is understood, however, that other embodiments may offer different advantages, and that no particular advantage is required for all embodiments. One advantage is that due to the use of the purified (B-11 enriched) Boron gas, the Tungsten plug can be formed to be substantially free of the B-10 isotope. Therefore, the soft error rate problems associated with a B-10 isotope may be prevented. Another advantage is that the processes of the present disclosure are compatible with existing fabrication process flow and thus involve no extra fabrication costs.

One of the broader forms of the present disclosure involves a method. The method includes providing a substrate. The method also includes forming a contact hole over the substrate. The method also includes forming a conductive contact in the contact hole using a $^{11}$B-enriched Boron material.

Another one of the broader forms of the present disclosure involves a method. The method includes providing a substrate. The method includes forming a portion of an interconnect structure over the substrate. The portion of the interconnect structure has an opening. The method includes obtaining a Boron-containing gas that is substantially free of a $^{10}$B isotope. The method includes filling the opening with a conductive material to form a contact. The filling is carried out using the Boron-containing gas.

Yet another one of the broader forms of the present disclosure involves a semiconductor device. The semiconductor device includes a substrate. The semiconductor device includes an interconnect structure formed over the substrate. The semiconductor device includes a conductive contact formed in the interconnect structure. The conductive contact has a material composition that includes Tungsten and Boron, wherein the Boron is a $^{11}$B-enriched Boron.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   providing a substrate;
   forming a transistor at least partially in the substrate, the transistor having a channel region;
   forming a contact hole over the substrate; and
   forming a conductive contact in the contact hole using a $^{11}$B-enriched Boron material, wherein the forming the conductive contact includes:
      forming a Tungsten-containing seed layer in the contact hole through an atomic layer deposition (ALD) process, wherein the $^{11}$B-enriched Boron material is used as a precursor in the ALD process; and
      performing a chemical vapor deposition (CVD) process after the ALD process, the CVD process forming a Tungsten material on the Tungsten-containing seed layer; and
   wherein the forming the conductive contact is carried out in a manner so that the conductive contact is spaced apart from the channel region by less than about 0.5 microns.

2. The method of claim 1, wherein the $^{11}$B-enriched Boron material has a $^{11}$B content that is higher than a $^{11}$B content of a Boron material in nature.

3. The method of claim 1, wherein the $^{11}$B-enriched Boron material has a $^{11}$B content that is higher than about 95%.

4. The method of claim 1, wherein the forming the conductive contact is carried out in a manner so that the conductive contact includes Tungsten.

5. The method of claim 1, wherein the forming the conductive contact includes forming the Tungsten-containing seed layer using the $^{11}$B-enriched Boron material.

6. The method of claim 1, wherein the method is performed as part of a fabrication process belonging to a technology node below a 90-nanometer technology node.

7. The method of claim 1, wherein the ALD process includes a plurality of process cycles, each process cycle including a soaking process followed by a nucleation process.

8. The method of claim 7, wherein:
   the soaking process produces the $^{11}$B-enriched Boron material from a $^{11}B_2H_6$ material; and
   the nucleation process produces a layer of Tungsten material from the $^{11}B_2H_6$ material and a $WF_6$ material.

9. The method of claim 8, wherein:
   the soaking process includes the following chemical process: $^{11}B_2H_6 => 2*\,^{11}B + 3*H_2$; and
   the nucleation process includes the following chemical process: $WF_6 + ^{11}B_2H_6 => W + 3*\,^{11}BF_3 + 3*H_2$.

10. The method of claim 1, wherein the $^{11}$B-enriched Boron material has a $^{11}$B content that is higher than about 99.7%.

11. A method, comprising:
    providing a substrate;
    forming a transistor at least partially in the substrate;
    forming a portion of an interconnect structure over the substrate, the portion of the interconnect structure having an opening;
    obtaining a Boron-containing gas that is substantially free of a $^{10}$B isotope; and
    filling the opening with a conductive material to form a contact, the filling the opening being carried out using the Boron-containing gas, wherein the filling the opening includes:
       forming a seed layer in the opening using an atomic layer deposition (ALD) process, the Boron-containing gas being used as a precursor in the ALD process; and
       forming a Tungsten material on the seed layer using a chemical vapor deposition (CVD) process; and
    wherein the conductive contact is formed to be less than about 0.5 microns from a channel region of the transistor.

12. The method of claim 11, wherein the Boron-containing gas contains a $^{11}$B isotope, and wherein a concentration of the $^{11}$B isotope in a Boron is greater than about 99.7%, and wherein a concentration of the $^{10}$B isotope in the Boron is less than about 0.3%.

13. The method of claim 12, wherein the ALD process includes a plurality of process cycles, each process cycle including a soaking process followed by a nucleation process.

14. The method of claim 13, wherein:
the soaking process produces the $^{11}$B isotope from a $^{11}$B$_2$H$_6$ material; and
the nucleation process produces a layer of Tungsten material from the $^{11}$B$_2$H$_6$ material and a WF$_6$ material.

15. The method of claim 14, wherein:
the soaking process includes the following chemical process: $^{11}$B$_2$H$_6$ => 2* $^{11}$B+3*H$_2$; and
the nucleation process includes the following chemical process: WF$_6$+$^{11}$B$_2$H$_6$=>W+3* $^{11}$BF$_3$+3*H$_2$.

16. The method of claim 11, wherein the filling the opening is carried out in a manner so that the contact is a Tungsten plug.

17. A method, comprising:
synthesizing a $^{11}$B-enriched Boron material through a plurality of chemical processes;
fabricating a transistor in a substrate, the transistor belonging to a technology node less than a 90 nanometer technology node, the transistor including a source, a drain, and a channel region disposed between the source and the drain;
forming a dielectric layer over the substrate;
forming an opening in the dielectric layer, the opening exposing one of the source and the drain and being disposed less than about 0.5 microns from the channel region; and
forming a Tungsten plug in the opening, wherein the forming the Tungsten plug includes:
forming a seed layer in the opening through an atomic layer deposition (ALD) process, wherein the $^{11}$B-enriched Boron material serves as a precursor in the ALD process, and wherein the ALD process includes a plurality of process cycles, each process cycle including a soaking process followed by a nucleation process; and
performing a chemical vapor deposition (CVD) process after the ALD process, the CVD process depositing a Tungsten material on the seed layer.

18. The method of claim 17, wherein:
the soaking process produces the $^{11}$B-enriched Boron material from a $^{11}$B$_2$H$_6$ material; and
the nucleation process produces a layer of Tungsten material from the $^{11}$B$_2$H$_6$ material and a WF$_6$ material.

19. The method of claim 18, wherein:
the soaking process includes the following chemical process: $^{11}$B$_2$H$_6$=>2* $^{11}$B+3*H$_2$; and
the nucleation process includes the following chemical process: WF$_6$+$^{11}$B$_2$H$_6$=>W+3* $^{11}$BF$_3$+3*H$_2$.

20. The method of claim 17, wherein the synthesizing the $^{11}$B-enriched Boron material is performed such that a concentration of a $^{11}$B isotope in the $^{11}$B-enriched Boron material is greater than about 99.7%.

\* \* \* \* \*